United States Patent [19]

Lalmond

[11] Patent Number: 4,692,683
[45] Date of Patent: Sep. 8, 1987

[54] OPTICAL POWER DISTRIBUTION SYSTEM

[75] Inventor: Richard G. Lalmond, Candia, N.H.

[73] Assignee: Sanders Associates, Inc., Nashua, N.H.

[21] Appl. No.: 832,119

[22] Filed: Feb. 24, 1986

[51] Int. Cl.⁴ .................................................. G02B 5/14
[52] U.S. Cl. ............................... 322/2 R; 136/291; 136/293; 323/906; 350/96.10
[58] Field of Search ............... 350/96.10, 96.18; 323/906; 368/205; 320/2; 322/2 R, 2 A

[56] References Cited

U.S. PATENT DOCUMENTS

| | | | |
|---|---|---|---|
| 3,179,861 | 4/1965 | Sclar | 317/235 |
| 3,757,511 | 9/1973 | Burgess et al. | 368/205 X |
| 3,896,368 | 7/1975 | Rym | 323/8 |
| 4,118,621 | 10/1978 | Monticelli et al. | 250/214 A |
| 4,209,735 | 6/1980 | Yoshida | 320/2 |
| 4,243,928 | 1/1981 | Nazimek | 323/906 X |
| 4,264,962 | 4/1981 | Kodaira | 364/707 |
| 4,281,208 | 7/1981 | Kuwano et al. | 136/249 |
| 4,369,498 | 1/1983 | Schulte | 364/707 |
| 4,411,490 | 10/1983 | Daniel | 350/96.18 X |
| 4,434,395 | 2/1984 | Higuchi | 320/1 |
| 4,449,057 | 5/1984 | Ishiwata | 307/43 |
| 4,623,869 | 11/1986 | Marubashi | 340/815.31 |

FOREIGN PATENT DOCUMENTS 0075971   7/1978   Japan .................................. 368/205

*Primary Examiner*—R. J. Hickey
*Attorney, Agent, or Firm*—Richard I. Seligman

[57] ABSTRACT

An optical power distribution system for supplying power to low power electrical devices includes an electrically powered source of optical radiation the output of which is applied to a photovoltaic cell array arranged on the device to be powered and electrically connected thereto.

7 Claims, 5 Drawing Figures

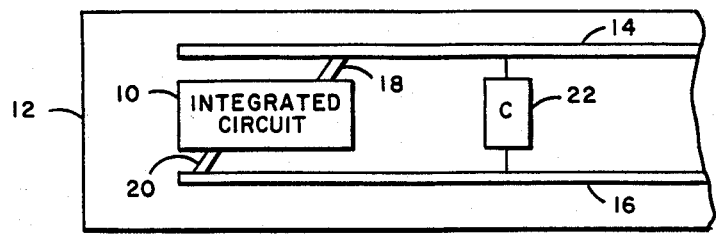
(PRIOR ART) FIG. 1
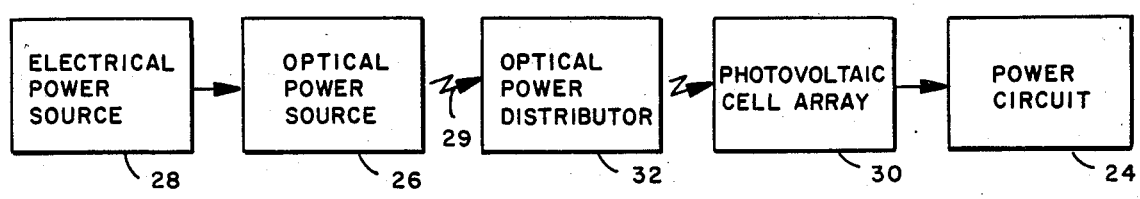
FIG. 2
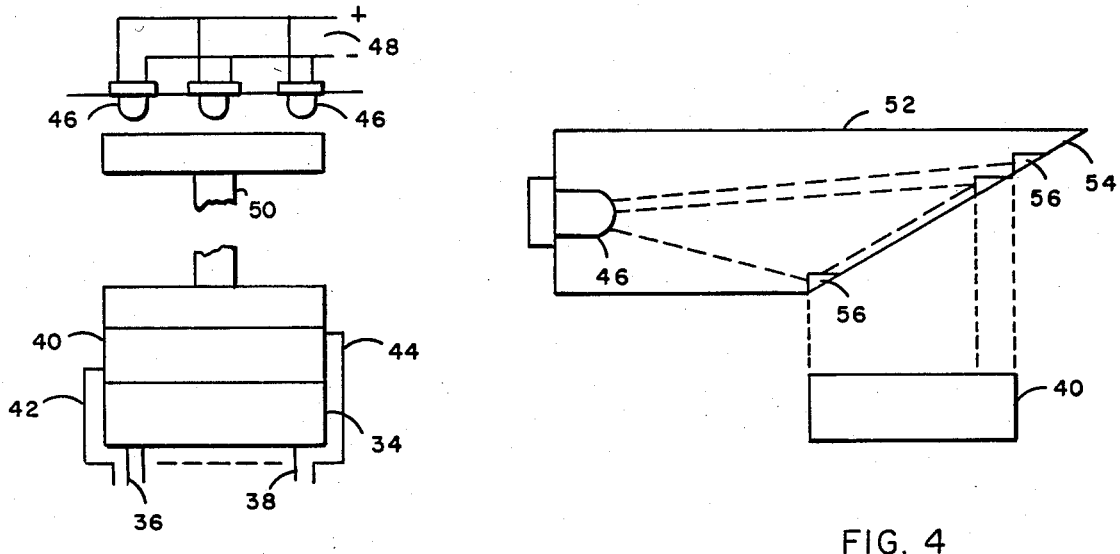
FIG. 3
FIG. 4
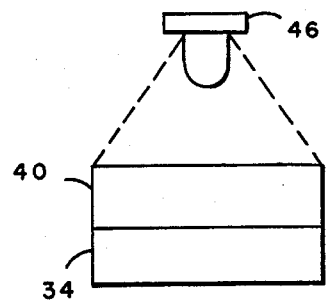
FIG. 5

OPTICAL POWER DISTRIBUTION SYSTEM

BACKGROUND OF THE INVENTION

This invention relates to power distribution systems for electronic circuits and, more particularly, to power distribution systems which employ optical coupling for low power electronic devices.

Prior to the present invention, high density electronic circuits utilized conventional discrete wiring or printed circuit wiring techniques to provide power to the devices of the electronic circuit, whether they be integrated circuits (ICs), hybrids or circuits made up of discrete components. A typical arrangement for supplying electrical power to such circuits is illustrated in FIG. 1 of the drawings. This figure shows an integrated circuit 10 arranged on a printed circuit board 12.

Also shown in the figure are two buses 14 and 16, which typically are made up of metal conductors affixed to the printed circuit board 12, to supply power to devices on the board such as IC 10. Wires or printed circuit connections 18 and 20 are used to connect the appropriate pins of IC 10 to the buses 14 and 16 so as to receive power. These connections 18 and 20 can be made by printed circuit wiring techniques or by discrete wiring. Typically, the printed circuit boards include holes therein in which to mount the pins of the IC with specific ones of the holes connected to the buses 14 and 16. Alternatively sockets are used to accomodate the IC device 10 and the sockets are mounted in the holes of the PC board, with the connections made in the same fashion as if made to the IC device itself.

Typical printed circuits also use a plurality of capacitors 22 connected across the bus lines 14 and 16. These capacitors are used to prevent transient propagation which can cause false triggering of the circuits of the IC devices or, if the devices are analog devices, to prevent corruption of an analog signal.

Many electronic circuits of the type shown in FIG. 1 must be of high density containing a maximum number of components on the printed circuit board. The techniques shown in FIG. 1 detract from the proper space utilization of the board in that the buses that supply power to the devices and the decoupling capacitors consume a lot of space which could accomodate additional ICs.

Another problem associated with power distribution of this type is the excessive current drain which can occur in the event one or more of the ICs connected to the power supply buses becomes shorted. In so called fail-safe systems where redundant circuits are used, failure of an IC due to a short can cause failure of the system even if a redundant IC is provided since current drain due to the short can disable the entire circuit.

Accordingly, it is an object of this invention to provide an improved power distribution system.

It is another object of this invention to provide an improved power distribution system which reduces the amount of space required on a printed circuit board.

It is a further object of this invention to provide a power distribution system which eliminates the requirement for providing decoupling components.

It is yet another object of this invention to provide a power distribution system which is not affected by isolated IC failure due to a shorted IC.

SUMMARY OF THE INVENTION

Briefly, an optical power distribution system for low power consumption circuits replaces that of conventional wired power distribution systems. The optical power distribution system employs a power source such as light emitting diodes to generate optical radiation which is distributed to an array of photovoltaic cells. The array of photovoltaic cells is placed on the surface of the device to be powered with the output leads of the photovoltaic cell array connected to the supply terminals of the device to be powered. Alternatively, the cover of the device to be powered can be removed and the photovoltaic cell array used in place thereof.

Using such an optical distribution system, the conventional power supplying buses are eliminated thus providing more space on, for example, printed circuit boards and also removing the problems attendant with such power supplying buses. No decoupling capacitors are required since each device to be powered is provided with its own photovoltaic cell array providing a separate power source for each discrete device. The elimination of a requirement for decoupling capacitors leaves more room for active components on the printed circuit board. In the event of the failure of one of the devices to be powered, none of the other of such devices is affected since each has its own distinct power source and no additional power is drained by the failed component.

BRIEF DESCRIPTION OF THE DRAWINGS

The above-mentioned and other features and objects of this invention will become more apparent by reference to the following description taken in conjunction with the accompanying drawings, in which:

FIG. 1 is a plan view of a portion of a typical power distribution system for printed circuit boards;

FIG. 2 is a block diagram of an optical power distribution system according to the principles of this invention;

FIG. 3 is a diagram of an optical power distribution system according to the principles of this invention;

FIG. 4 is an illustration of a portion of an optical distribution system showing a different optical power distributor from that shown in FIG. 3; and FIG. 5 is a further embodiment of an optical power distribution system having no requirement for an optical power distributor.

DESCRIPTION OF PREFERRED EMBODIMENTS

Referring now to FIG. 2 of the drawings, there is illustrated thereby in block diagram format the principles of this invention. The function of the invention is to provide electrical power to a circuit 24 such as IC 10 of FIG. 1. In accordance with the principles of this invention, power is not provided to such a circuit on a printed circuit board by connecting to power distribution buses on the board but rather through an optical coupling arrangement.

An optical power source 26, which is powered from an electrical power source 28, supplies optical energy 29. Typically, optical power source is an array of light emitting diodes. However, other optical power sources can be used instead including incandescent light bulbs and the like. The optical power 29 is applied to a plurality of photovoltaic cell arrays 30 which generate the electrical power for the circuit 24. Typically, one photovoltaic cell array is provided for each of the circuits 24. However, it is possible to employ a large photovoltaic cell array 30 to supply power to a number of circuits 24. The required voltage is determined by the number of cells in the array and the required current by the surface area of the cells.

The radiation 29 from the optical power source is applied to the photovoltaic cell array through an optical power distributor 32, a couple of embodiments of which will be described hereinafter. I will also describe an embodiment in which the radiation 29 is applied to the photovoltaic cell array 30 directly. Because photovoltaic cells are generally highly responsive in the near infrared region of the spectrum, it is preferred that optical power source 26 be rich in near infrared energy. However, energies in other portions of the spectrum can be used instead or in addition, such as the visible, as long as the photovoltaic cell array 30 is responsive to such energy and produces an electrical output in response thereto.

One embodiment of the invention is illustrated in FIG. 3 of the drawings and comprises an IC device 34 having a plurality of terminals, including terminals 36 and 38 for providing electrical power thereto. This device is typically plugged into holes on a printed circuit board or alternatively into a socket having leads which are plugged into the holes on the printed circuit board. Disposed on top of IC device 34 is a photovoltaic cell array 40. The photovoltaic cell array 40 is placed over the top of the housing of the IC device 34 or alternatively the cover of the IC device 34 is removed and the photovoltaic cell array 40 replaces it. Preferably epoxy is used to place the photovoltaic cell 40 on the IC device 34. The photovoltaic cell array 40 has output leads 42 and 44 for providing electrical power from the device. These output leads are arranged to be placed in proximity to the power input leads 36, 38 of the IC component so that they both can be placed in the same holes in the PC board or in the same holes in the socket which receives the IC component. Thus, electrical power from the photovoltaic cell array 40 is connected to the leads 36 and 38 to provide power for the IC device.

Optical energy for the photovoltaic cell array is provided from a plurality of optical power sources 46 which in this embodiment are light emitting diodes. These light emitting diodes 46 receive electrical power via a source 48. The optical output from the light emitting diodes 46 is applied to the photovoltaic cell array 40 via a fiberoptic bundle 50.

It is seen by this arrangement that the typical power buses 14, 16 and the decoupling capacitors 22, as shown in FIG. 1, are eliminated therefore providing room on the printed circuit board for additional IC components. In this arrangement each IC circuit 34 has its own individual power source, and there is no intercoupling between other IC devices. In the event of a failure of any IC device, such as by shorting, no power is drained from other devices so as to possibly disable the entire circuit. Ground loop problems are also eliminated by this arrangement. Since the photovoltaic cell array is placed on top of the device to be powered, it uses no additional area of the printed circuit board.

An alternative means of coupling electrical energy from the optical sources to the photovoltaic cell array is illustrated in FIG. 4 of the drawings. For purposes of clarity, the IC device is omitted from this drawing, however, in this drawing the photovoltaic cell array 40 would be placed on top of the IC device in the manner described with respect to FIG. 3. In this embodiment, optical power is distributed to the photovoltaic cell array using a polystyrene panel 52 having a beveled surface 54 and a plurality of transverse stepped grooves to enhance the desired illumination at a right angle to the panel plane, however, other materials can be used instead for distributor 52, such as glass.

FIG. 5 illustrates another embodiment of the invention in which power from light emitting diodes 46 is applied to a photovoltaic cell array 40 situated on top of an IC device 34. However, in this embodiment, no intermediate optical power distributor 32 is used. Instead, the output of the light emitting diodes 46 is applied directly to the surface of the photovoltaic array 40. Although only one light emitting diode is shown, additional light emitting diodes would be used to obtain the necessary amount of power. In this embodiment not requiring the use of an optical power distributor an electroluminescent panel could be used as the optical power source. It would be placed over and in close proximity to the photovoltaic cell array.

In one reduction to practice of the invention, two OP-32 operational amplifiers manufactured by Precision Monolithics, Inc. were set up to draw approximately 10.5 microamps supply current, each from a 3 volt supply. In order to obtain 3 volts, a nine cell photovoltaic array was constructed using readily available silicon P-N junction one-square centimeter cells connected electrically in series. To convert electrical power to optical energy, four gallium arsenide light emitting diodes were connected in series and energized by a laboratory power supply. Optical power was distributed to the photovoltaic cell array with a polystyrene panel similar to that shown in FIG. 4 of the drawings. The components described were selected for ready availability rather than optimal power transfer capability. Adequate power was obtained to provide outputs from the operational amplifiers. The test clearly indicated that sufficient energy can be generated and optically coupled to the functional circuits such as to derive the benefits of optical coupling power.

Thus, the invention described does supply adequate power to power the devices and does provide for physical removal of power supply lines and decoupling components reducing the required board space on a printed circuit board. Additionally as mentioned above, a feature inherent in this arrangement is complete reverse isolation of power distribution such that an isolated IC failure due to excessive current drain (such as a shorted IC) does not affect the power distribution system. This aspect lends itself readily to fail-safe redundant functions of critical circuits. The entire process is applicable to any low power function such as a hybrid module where the photovoltaic cell array may be placed over the hybrid cover or replace the cover in part or in whole, or to low power discrete component circuits with the photovoltaic cell array located above (or removed from) the circuit component mounting circuit.

Although specific optical power distributors have been shown to couple the optical power from the power source light emitting diodes to the photovoltaic cell array, this is exemplary only and many different means for conducting the output from the light emitting diodes to the surface of the photovoltaic cell array will be readily apparent to those skilled in the art. Thus, it is to be understood that the embodiments shown are to be illustrative only and that many variations and modifications can be made without departing from the principles of the invention herein disclosed and defined by the appended claims.

I claim:

1. Apparatus for supplying electrical power to a plurality of electrical components mounted on a circuit board, comprising:

a printed circuit board;

a plurality of electrical components mounted on said printed circuit board;

a plurality of electrically powered sources of optical energy;

a plurality of photovoltaic cell arrays;

each photovoltaic cell array being mounted on a corresponding one of said electrical components to provide electrical power to the electrical component on which it is mounted; and means for coupling the optical energy from said plurality of electrically powered sources of optical energy to said photovoltaic cell arrays.

2. Apparatus as defined in claim 1, wherein said electrical components are integrated circuits.

3. Apparatus as defined in claim 1, wherein said electrical components are hybrid circuits.

4. Apparatus as defined in claim 2, wherein each integrated circuit is mounted in a housing in which each photovoltaic cell array is the cover for said housing.

5. Apparatus as defined in claim 3, wherein each hybrid is mounted in a housing in which each photovoltaic cell array is the cover for said housing.

6. Apparatus as defined in claim 1, wherein said coupling means includes a fiberoptic bundle.

7. Apparatus as defined in claim 1, which said coupling means includes optics to redirect the direction of the optical energy.

* * * * *